United States Patent [19]

Bula et al.

[11] Patent Number: 5,317,573
[45] Date of Patent: May 31, 1994

[54] APPARATUS AND METHOD FOR REAL TIME DATA ERROR CAPTURE AND COMPRESSION REDUNDANCY ANALYSIS

[75] Inventors: Orest Bula, Shelburne; Garrett S. Koch, Cambridge; Justin A. Woyke, Essex Junction, all of Vt.; Richard S. Gomez, Forest Grove, Oreg.

[73] Assignee: International Business Machines Corporation, Armonk, N.Y.

[21] Appl. No.: 839,678

[22] Filed: Feb. 24, 1992

Related U.S. Application Data

[63] Continuation of Ser. No. 400,860, Aug. 30, 1989, abandoned.

[51] Int. Cl.⁵ .............................................. G11C 29/00
[52] U.S. Cl. .................................. 371/10.3; 371/21.6
[58] Field of Search ............................. 371/10.3, 21.6

[56] References Cited

U.S. PATENT DOCUMENTS

| | | | |
|---|---|---|---|
| 4,456,995 | 6/1984 | Ryan | 371/21.6 |
| 4,460,997 | 7/1984 | Harns | 371/10.3 |
| 4,460,999 | 7/1984 | Schmidt | 371/10.3 |
| 4,586,178 | 4/1986 | Bosse | 371/10.3 |
| 4,627,053 | 12/1986 | Yamaki et al. | 371/10.3 |
| 4,628,509 | 12/1986 | Kawaguchi | 371/10.3 |
| 4,639,915 | 6/1985 | Bosse | 371/10.3 |

FOREIGN PATENT DOCUMENTS

| | | |
|---|---|---|
| 52-67227 | 3/1977 | Japan . |
| 55-28119 | 2/1980 | Japan . |
| 55-34380 | 3/1980 | Japan . |
| 55-113200 | 9/1980 | Japan . |
| 56-61100 | 5/1981 | Japan . |
| 56-73354 | 6/1981 | Japan . |
| 56-73355 | 6/1981 | Japan . |
| 56-84056 | 7/1981 | Japan . |
| 56-124200 | 9/1981 | Japan . |
| 56-130899 | 10/1981 | Japan . |
| 57-88600 | 6/1982 | Japan . |
| 57-130295 | 8/1982 | Japan . |
| 57-164500 | 9/1982 | Japan . |
| 57-164497 | 10/1982 | Japan . |
| 58-115698 | 7/1983 | Japan . |
| 58-207497 | 11/1984 | Japan . |
| 60-70375 | 4/1985 | Japan . |
| 60-167199 | 8/1985 | Japan . |
| 60-167200 | 8/1985 | Japan . |
| 61-68800 | 4/1986 | Japan . |
| 61-80070 | 4/1986 | Japan . |
| 61-199300 | 9/1986 | Japan . |
| 61-271700 | 12/1986 | Japan . |

OTHER PUBLICATIONS

Tarr, M., "Defect Analysis System Speeds Test and Repair of Redundant Memories", *Electronics*, Jan. 12, 1984, pp. 175-179.

IBM Technical Disclosure Bulletin, vol. 29, No. 6, Nov. 1986, "Best Solution Generator For Redundancy", pp. 2756-2758.

*Primary Examiner*—Stephen M. Baker
*Attorney, Agent, or Firm*—Sughrue, Mion, Zinn, Macpeak & Seas

[57] ABSTRACT

Fail information from testing of a DUT memory array is captured and compressed by utilizing a compression matrix which is related in size to the available redundancy associated with the DUT (device under test) memory array, and which, in essence, defines the limits of redundancy repair. The compression matrix includes a plurality of matrix cells fewer in number than the number of memory cells in the DUT memory array and is arranged in a matrix of compression rows and compression columns, the number R of compression rows in the compression matrix being equal to (a predetermined number of redundant rows in the memory array) times (a predetermined number of redundant memory columns+1), and the number C of compression columns in the compression matrix being equal to (a predetermined number of redundant memory columns) times (a predetermined number of redundant memory rows+1). The compression matrix is loaded with the fail information concurrently with testing of the DUT memory array.

1 Claim, 6 Drawing Sheets

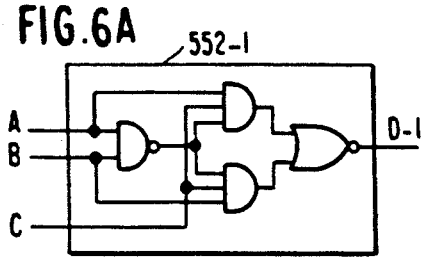
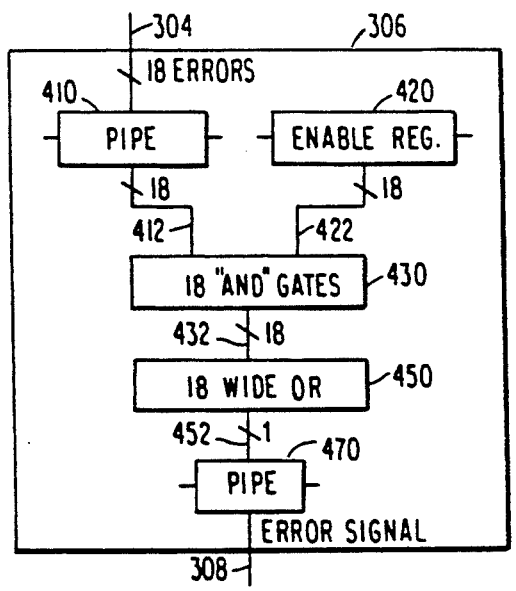
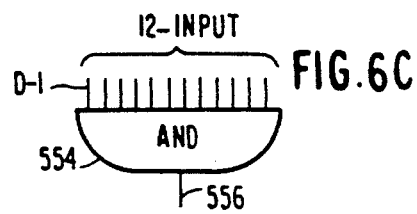
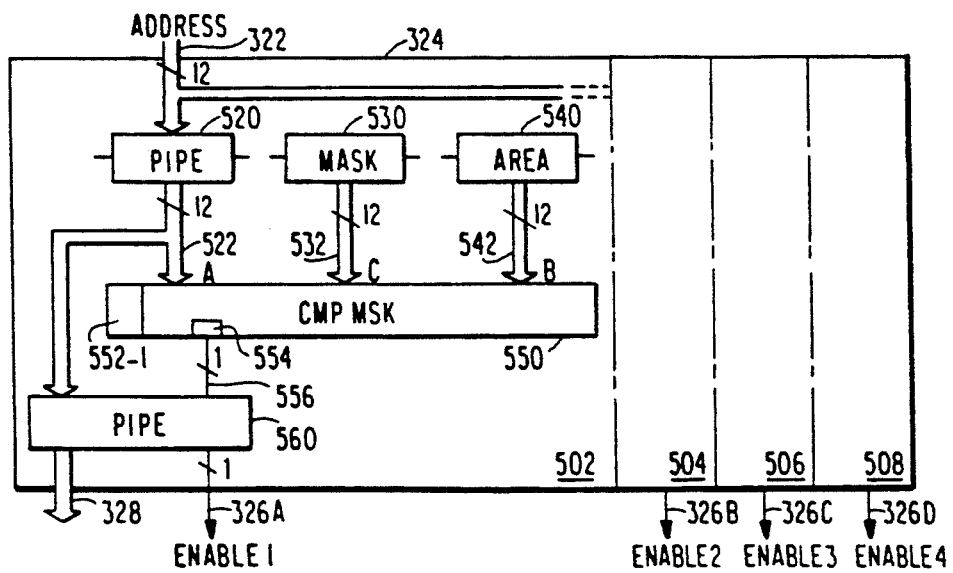

APPARATUS AND METHOD FOR REAL TIME DATA ERROR CAPTURE AND COMPRESSION REDUNDANCY ANALYSIS

This is a continuation of application No. 07/400,860 filed Aug. 30, 1989 now abandoned.

TECHNICAL FIELD OF THE INVENTION

The present invention is directed to an apparatus and method for real time data error capture and compression for redundancy analysis.

BACKGROUND OF THE INVENTION

In order to analyze and effect redundancy to repair defective memory rows and/or columns of a memory device (e.g., a RAM), all fail information with respect to the memory array of the device must be captured and analyzed. Several approaches are known in the art:

U.S. Pat. No. 4,456,995 (Ryan; assigned to the assignee of the present application) discloses an approach wherein a counter is provided which is capable of providing a count value up to the number of bits in a RAM under test, and wherein there is a counting of fails by word line, and then by bit line in a two pass test.

U.S. Pat. No. 4,460,999 (Schmidt; related to the '997 Harns patent); U.S. Pat. No. 4,460,997 (Harns; related to the '999 Schmidt patent) disclose approaches which employ an error capture RAM which is configured both in size and arrangement to mirror those of a RAM under test. Testing is conducted, and any memory failures which occur along the memory array are recorded in a corresponding location in the error capture RAM. In order to extract the fail information from the error capture RAM to perform redundancy analysis, time-consuming software routines or special hardware is required.

The just-discussed conventional apparatus and method are disadvantageous in that, error capture RAMs increase in cost as the device under test (DUT) grows in size, and in addition, the extraction of fail information also grows in complexity, typically requiring several passes through the error capture RAM resulting in substantial time consumption.

U.S. Pat. No. 4,586,178 (Bosse; related to the Bosse '915 patent) and U.S. Pat. No. 4,639,915 (Bosse; related to the Bosse '178 patent) are directed to array testing apparatus for determining fail positions, and a method for replacing the fails with redundant lines. An analog summer is used to count the fails and the failed row and column addresses are stored in separate parallel lists requiring both addresses to be stored for each fail. Such arrangement causes the speed of the Bosse circuit to be lowered because of cycle time, and also causes bit failure address latches and a fail matrix to be substantially large.

U.S. Pat. No. 4,627,053 (Yamaki et al) discloses a method of repairing a semiconductor memory device having spare lines. All possible solutions of remedy using spare lines or spare blocks are obtained via analysis of the result of a test of the device, and then all possible solutions are screened under conditions related to the quality and reliability of the device so as to determine a best solution.

U.S. Pat. No. 4,628,509 (Kawaguchi) discloses an array testing apparatus designed to replace failed lines with redundant lines, by utilizing RAMs as look-up tables for storing fails. Disadvantages are present as there is a slowing of a speed of the circuit, and also, the fail counters are arranged such that there is a potential that some fails will be missed.

JP 52-67227 (Takezono) discloses a memory unit wherein failure areas which occur in clusters are collected together and memorized by an auxiliary memory.

Further approaches of background interest are described in: JP 55-28119 (Narumi); JP 55-34380 (Narumi); JP 56-61100 (Aida); JP 55-113200 (author unknown); JP 56-73354 (author unknown); JP 56-73355 (author unknown); JP 56-84056 (author unknown); JP 56-124200 (Nozaki); JP 56-130899 (author unknown); JP 57-88600 (Ishiguro); JP 57-130295 (Nigorikawa); JP 57-164497 (Miyazaki); JP 57-164500 (Eguchi); JP 58-115698 (Nishimoto); JP 59-207497 (author unknown); JP 60-70375 (author unknown); JP 60-167199 (Matsuoka); JP 61-68800 (author unknown); JP 61-80070 (author unknown); JP 60-167200 (author unknown); JP 61-199300 (Sueyoshi); JP 61-271700 (author unknown).

SUMMARY OF THE INVENTION

An object of the present invention is to provide a method and apparatus allowing analysis of redundancy on a random access memory (RAM), wherein fail information is captured and analyzed.

Another object of the present invention is to provide a method and apparatus which allow the capture and compression of failures at test speeds.

Another object is to provide a method and apparatus which allow compressed fail data to be loaded directly into a matrix upon which a hardware analyzer operates.

A further object is to provide such a method and apparatus which allow testing and repair analysis to occur simultaneously.

Another object is to provide such a method and apparatus which minimize repair time.

Still another object of the present invention is to provide such a method and apparatus having zero impact on test time.

Another object is to provide an improved memory tester having memory repair and analysis capability.

A further object is to allow an error register to be preset with a predetermined error mask value for masking out preselected bits of error signals resulting from testing of a memory array, such that fail information is derived only from unmasked bits of error signals.

Another object of the present invention is to allow a mask register to be preset with a predetermined address mask value for masking out preselected bits of address signals resulting from testing of a memory array, and an area register to be preset with a predetermined area value containing bits indicating which address signals are of interest, wherein fail information is derived only from fails in which unmasked address bits correspond to the area value.

Yet another object is to allow any desired compression matrix size to be programmably defined.

A further object is to include overflow signaling which represents an immediate indication that repair of a memory array under test cannot be effected with the available number of redundant rows and columns in the memory array.

The above and other objects of the present invention are achieved by providing an apparatus and method for capturing and compressing fail information from testing of a DUT (device under test) memory array by utilizing a compression matrix which is related in size to the available redundancy associated with the DUT memory array, and which, in essence, defines the limits of redundancy repair. The compression matrix includes a plurality of matrix cells fewer in number than the number of memory cells in the DUT memory array and is arranged in a matrix of compression rows and compression columns, the number R of compression rows in the compression matrix being equal to (a predetermined number of redundant memory rows) times (a predetermined number of redundant memory columns+1), and the number C of compression columns in the compression matrix being equal to (a predetermined number of redundant memory columns) times (a predetermined number of redundant memory rows+1). There are also provided: means for loading the compression matrix with the fail information concurrently with testing of the DUT memory array; and column and row selects for storing, and assigning to each compression column or row of at least a portion of the compression columns and rows, a different column-address or row-address portion of the fail information and for providing selection of compression columns and rows according to stored column and row address portions. Comparators compare, for each compression column and row, a count of matrix cells set along each column and row with a predetermined redundancy value. When the count becomes greater than the redundancy value, there is a designation of a memory array column or row as a "must fix", and there is a blockage of storage of row-address or column-address portions, respectively, of fail information having the same column-address or row-address portion as the memory array column or row, respectively, which has been designated as a "must fix."

The novel features which are believed to be characteristic of the present invention, both as to its organization and as to its method of operation, together with further objects and advantages thereof, will be better understood from the following description, considered in connection with the accompanying drawings in which a presently preferred embodiment of the invention is illustrated by way of example. It is expressly understood, however, that the description of the preferred embodiment and drawings are for the purpose of illustration and description only, and are not intended as a definition of the limits of the invention.

BRIEF DESCRIPTION OF THE DRAWINGS

FIG. 4 is a block diagram showing further construction details of an error select latch illustrated in FIG. 3.

FIG. 5A is a block diagram showing further construction details of either of the area select latches illustrated in FIG. 3.

FIG. 5B is a logic truth table useful in explaining the operation of the area select latch of FIG. 5A.

FIG. 6A is a logic gate diagram showing further construction details of a compare mask circuit illustrated in FIG. 5A.

FIG. 6B is a logic truth table useful in explaining the operation of the compare mask circuit of FIG. 6A.

FIG. 6C is a logic gate diagram showing further construction details of an AND gate which is used in the compare mask circuit illustrated in FIG. 5A.

Throughout the drawings, parts having identical functions are designated by identical reference numerals.

DETAILED DESCRIPTION OF A PREFERRED EMBODIMENT OF THE INVENTION

Before beginning a discussion, several qualifications are made:

The description contained in this specification often discusses parts and arrangements constructed of logical gates (e.g., AND gates, OR gates, etc.) and logical levels (e.g., logical "1", logical "0", etc.) on input terminals and/or lines associated with these logical gates. It is expressly understood, however, that implementation of the present invention by substituting logical gates and levels of opposite polarity (i.e., opposite to those described) for any portion or a complete circuit arrangement of the described embodiment, are well within the abilities of a skilled artisan, and such are meant to be within the scope of the claimed invention. Further, implementation of the functions of some or all of the logical gates and other circuits utilizing other processing circuits or means (e.g., a microprocessor) are also well within the abilities of a skilled artisan, and such are also meant to be within the scope of the claimed invention.

For the purposes of this specification, the terms "column" and "row" are designated as the vertical and horizontal matrix lines, respectively, when viewing the figure drawings in a proper upright position, and further, are synonymous with the X and Y axis. It is expressly understood, however, that such designations are arbitrary in choice, and that alternative designations may be made without departing from the scope of the claimed invention.

Figure 1:
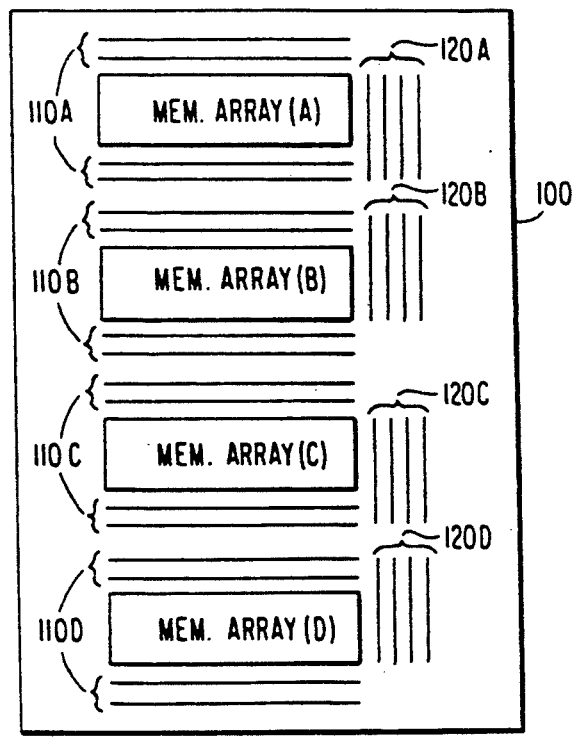
FIG. 1 is a block diagram showing redundancy rows and columns associated with memory array subdivisions of a typical device under test (DUT), to which the present invention is applied.

In the drawings, FIG. 1 is a block diagram illustration showing redundancy rows and columns associated with memory array subdivisions of a typical device under test (DUT) to which the present invention is applied. More particularly, DUT 100 is illustrated as having a memory array which is subdivided into four array areas: a memory array (A) having four redundancy rows 110A and four redundancy columns 120A; a memory array (B) having four redundancy rows 110B and four redundancy columns 120B; a memory array (C) having four redundancy rows 110C and four redundancy columns 120C; and a memory array (D) having four redundancy rows 110D and four redundancy columns 120D.

The redundancy rows 110 and columns 120 are used as replacement rows or columns for any defective rows or columns within the memory array which they are associated; for example, the redundancy rows 110A and the redundancy columns 120A serve as replacement rows or columns for any defective rows or columns within the memory array (A).

In contrast to the above-described approach wherein an error capture RAM is configured both in size and arrangement to mirror those of the RAM under test, it has been found that redundancy analysis requires only compressed fail information, and, if such compressed fail information can be stored in real time, the error capture RAM is not needed.

More particularly, in order to allow the capture and compression of memory array failures at test speeds, the present invention directly loads compressed fail data into a compressed matrix, wherein a hardware analyzer can then operate on the data to determine "must repair" rows and columns (discussed ahead) and then the compressed data can be output to further analysis circuits. This approach allows simultaneous test and repair analysis and, accordingly, is the ultimate solution for minimum repair time with zero impact on test time.

Before discussing the compression matrix of the present invention, the following further qualification is made.

Testing and repair analysis according to the present invention is separately conducted for each of the memory array (A)-(D) subdivisions as separate redundancy rows 110 and redundancy columns 120 are associated with each memory array subdivision. These separate testing and repair analyses for each memory array subdivision can be performed as sequential, time-separated operations utilizing a single embodiment of the present invention, or can be preformed as simultaneous operations utilizing multiple embodiments of the present invention in parallel.

For the sake of simplicity, in the following discussion it will be assumed that testing and repair analysis is being performed on a single memory array (A) subdivision.

Figure 2:
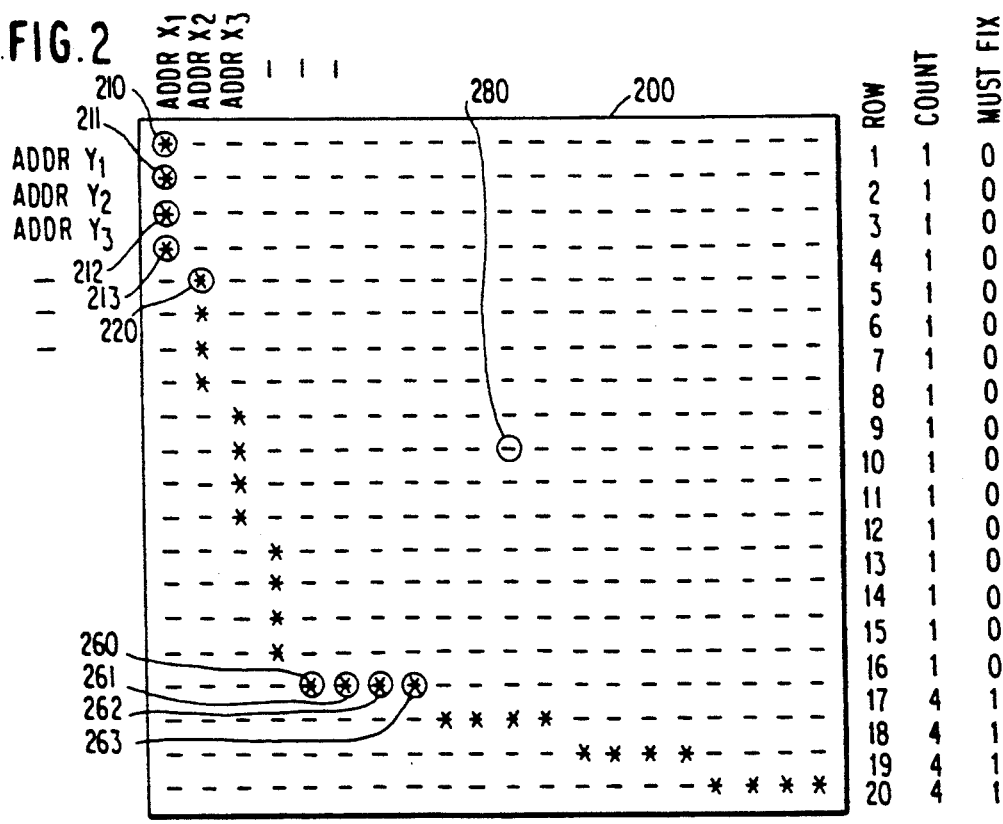
FIG. 2 is a simplified illustration of a compression matrix which is utilized to store compressed fail information in the preferred embodiment of the invention, and which, in a preferred embodiment, corresponds to 20×20 matrix.

FIG. 2 is a simplified illustration of a compression matrix which is utilized to store compressed fail information in a preferred embodiment of the invention, and which corresponds to 20×20 matrix. More particularly, a 20×20 matrix 200 is illustrated as having rows 1 to 20 and columns 1 to 20. Accordingly, matrix 200 includes $R \times C$, $R^2$, or $C^2$ number of matrix cells, where R is the number of rows of the matrix, and C is the number of columns of the matrix. Throughout the illustrated 20×20 matrix, the "—" symbols indicate matrix (cell) locations in which fail information has not been stored, and the "*" symbols indicate matrix (cell) locations in which fail information has been stored.

There are two important aspects to note with regard to the compression matrix 200.

First, the rows and columns of the compression matrix do not directly correspond to the rows and columns of the memory array subdivision of the DUT, as will become more apparent in the following discussions.

Second, as a rule, a row or column is designated as a "must fix" row or column as soon as the number of failures detected along that row or column reaches (hereinafter, "must fix failure number") the number of the opposite columns or rows, respectively, which is available for repair. The rationale for this rule is that it is more economical, in terms of testing time and in terms of use of redundancy, immediately to designate and use a single redundancy row or column to repair the detected failures, when it is known that to make repairs using the opposite columns or rows, respectively, would take additional repair (programming) time and exhaust all the opposite columns or rows, respectively, to repair the same detected failures. In the present example, there are four redundancy rows 110A and four redundancy columns 120A which can be used for repairing the memory array (A). Accordingly, as illustrated in FIG. 2, each of the columns 1-4 assigned and associated with the addresses ADDR $X_1$, ADDR $X_2$, ADDR $X_3$ and ADDR $X_4$, respectively, has an error count of "4", and is therefore designated as a "must fix" column (indicated by the logical value "1" along the MUST FIX entries). Similarly, each of the rows 17-20 assigned and associated with the addresses ADDR $Y_{17}$, ADDR $Y_{18}$, ADDR $Y_{19}$ and ADDR $Y_{20}$, respectively, has an error count of "4", and is therefore designated as a "must fix" column (indicated by the logical value "1" along the MUST FIX entries).

The above-discussed "must fix" rule and the available row and column redundancy of the memory array under test, in essence, define the size of the required compression matrix. As will be shown in the following discussions, any additional failures, along a "must fix" row or column and beyond the "must fix failure number" are ignored during testing and repair analysis with the present invention. Accordingly, in determining the number R of rows which may be needed in the compression matrix, each of the columns (four in the present example) may require a number of unique compression matrix rows which is equal to the "must fix failure number" (four, in the present example; leading to a total of sixteen compression matrix rows needed for analysis with the columns), and, as the redundancy rows may repair additional unique rows which are not repaired by the redundancy columns, a further number of compression matrix rows which is equal to the number of memory array redundancy rows, is also required (four, in the present example). Similar analysis can be made to determine the number C of columns required in the compression matrix.

In typical redundancy implementations, the number of redundancy rows in the memory array is equal to the number of redundancy columns. In such a case, a compression matrix required with respect to the present invention would be a square matrix (i.e., having equal numbers of compression matrix rows and columns), and the foregoing analysis with regard to the determination of a size "A" of the required compression matrix size can also be stated generally in terms of a mathematical formula as follows:

EQ. 1:
$A = $ [(number of redundancy columns) times (number of redundancy rows)] + (number or redundancy rows)

or alternatively, as follows:

EQ. 2:
$A = $ (number of redundancy columns) times [(number of redundancy rows) + 1]

In the present example, having four redundancy columns and four redundancy rows, it can be seen applying either of EQ.1 [i.e., A=(4×4)+4] or EQ.2 [i.e., A=4×(4+1)] that "A" is equal to 20, and accordingly, a 20×20 matrix is required for testing and repair analysis according to the present invention.

In an example having two redundancy columns and two redundancy rows, "A" would be equal to 6, and accordingly, a 6×6 matrix would be required for testing and repair analysis according to the present invention.

It is further submitted that there is no requirement that a defined matrix be symmetrical according to both axes, for example, a 6×12 matrix could be used where there is 2×3 redundancy available. Such feature is important, in that, the present invention allows fail information capture and compression and repair analysis to be conducted in situations where one of the redundancy lines itself is unusable due to processing defects and/or fails. The present invention has the further advantageous feature of allowing any desired matrix size to be programmably defined as discussed below with respect to an overflow signalling arrangement.

The arrangement of the present invention and the matrix size of the compression matrix, in essence, define the limits of redundancy repair. More particularly, if captured errors cannot be compressed to fit within the compression matrix (i.e., an overflow is signaled as discussed below), such is an indication that the DUT cannot be repaired with the available redundancy, and DUT testing, data capture and compression can immediately be stopped, thereby saving testing time. It should be further indicated that opposite is not true, i.e., capture and compression of the total errors to fit within the compression matrix are not any guarantee that the DUT can be repaired by the available redundancy. An example of such will be presented in the discussions below.

Figure 3:
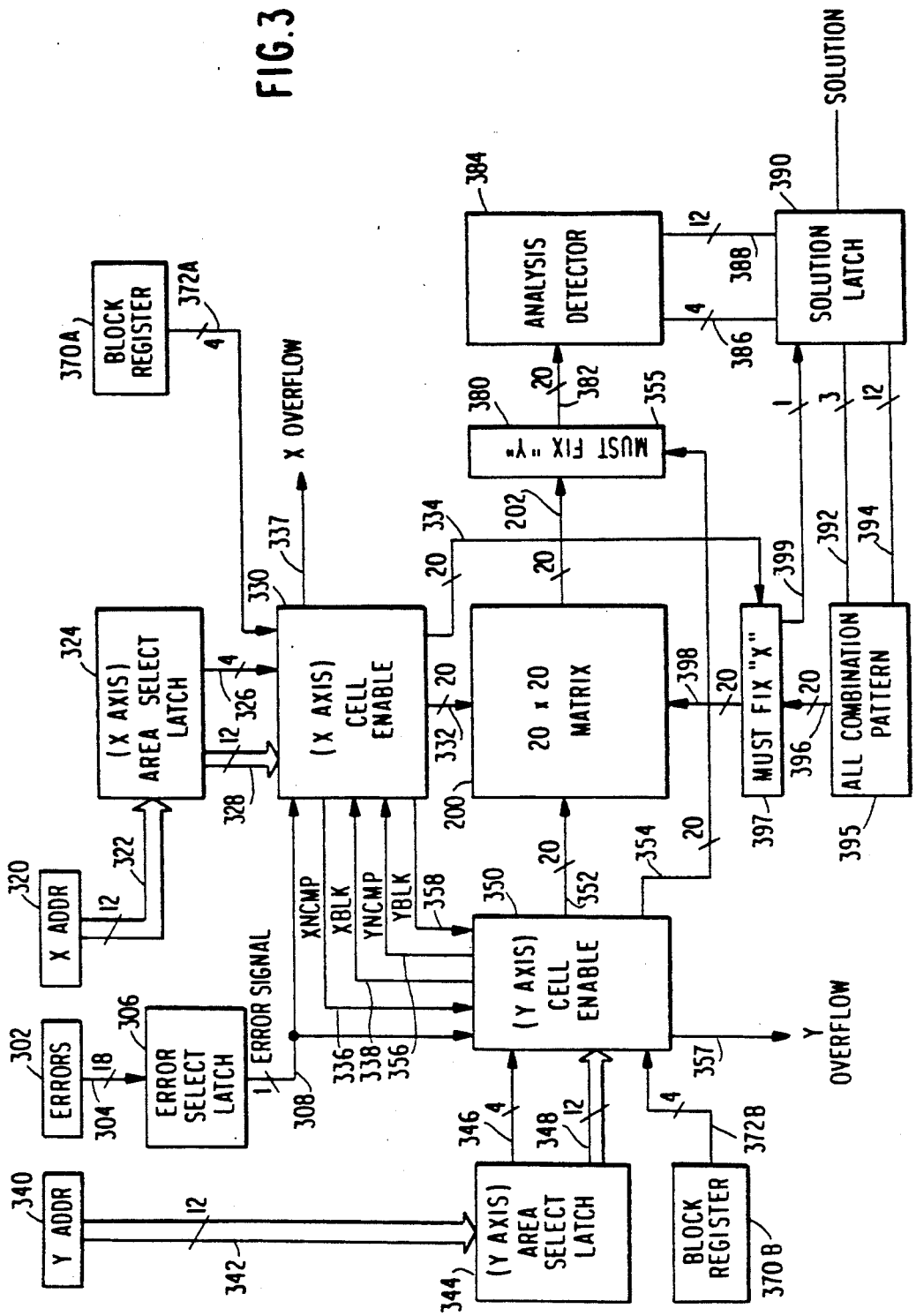
FIG. 3 is a block diagram of the preferred embodiment of an apparatus for capturing and compressing fail information which allows real time data error capture and compression for redundancy analysis.

FIG. 3 is a block diagram of the preferred embodiment of an apparatus for capture and compression of fail information, which allows real time data error capture and compression for redundancy analysis.

Exterior to the embodiment illustrated in FIG. 3, sequential (or another type of) addressing and memory testing of a DUT are conducted by any peripheral apparatus or method well known in the art (not shown), and the y-addresses YADDR 340, errors 302, and x-addresses XADDR 320 which are generated, are provided to the preferred embodiment of FIG. 3.

Errors 302 are fed along eighteen bit lines 304 to an error select latch 306 which generates and outputs an error signal along a single bit line 308 which is fed to an (x-axis) cell enable 330 and a (y-axis) cell enable 350.

The x-addresses XADDR 320 are fed along twelve bit lines 322 to an (x-axis) area select latch 324 which eventually passes the x-addresses along twelve bit lines 328, and which generates and outputs four block signals (discussed ahead) along four bit lines 326.

A (x-axis) cell enable 330 receives the x-addresses along the twelve bit lines 328, ENABLE 1-4 signals along the four bit lines 326, an error signal along the line 308, a y-no-compare (YNCMP) signal along a line 356, an x-block (XBLK) signal along a line 338, and BLOCK 1-4 signals along the four bit lines 372A. In response, the (x-axis) cell enable 330 may generate an X signal along one of the twenty column lines 332 for input to the 20×20 matrix 200, a MUST FIX k signal along one of the twenty signal lines 334, and an overflow signal along the line 337.

Similarly, the y-addresses YADDR 340 are fed along twelve bit lines 342 to an (y-axis) area select latch 344 which eventually passes the y-addresses along twelve bit lines 348, and which generates and outputs four block signals (discussed below) along four bit lines 346.

A (y-axis) cell enable 350 receives the y-addresses along the twelve bit lines 348, ENABLE 1-4 signals along the four bit lines 346, an error signal along the line 308, an x-no-compare (XNCMP) signal along a line 336, a y-block (YBLK) signal along a line 358, and BLOCK 1-4 signals along the four bit lines 372B. In response, the (y-axis) cell enable 350 may generate a Y signal along one of the twenty row lines 352 for input to the 20×20 matrix 200, a MUST FIX $\overline{Y}$ signal along one of the twenty signal lines 354, and an overflow signal along the line 357.

A block register 370 (i.e., 370A and 370B) outputs BLOCK 1-4 signals along the lines 372A and 372B to the (x-axis) and (y-axis) cell enables 330 and 350, respectively.

A must-fix-y circuit 380 receives outputs from the 20×20 matrix along the twenty lines 202, and outputs signals along the twenty lines 382 to an analysis detector 384.

The analysis detector 384 receives the signals along the twenty lines 382, and outputs signals along the lines 386 and 388 to the solution latch 390 which also receives a signal along a line 399 and outputs a solution.

Signals are also communicated between the solution latch 390 and an all combination pattern circuit 395 along the lines 392 and 394, and the all combination pattern circuit 395 outputs signals along the lines 396.

Finally, a must-fix-x circuit 397 receives the signals along the lines 396, and outputs both signals to the 20×20 matrix along the lines 398 and also a signal to the solution latch along the line 399.

FIG. 4 is a block diagram showing further construction details of the error select latch illustrated in FIG. 3. More particularly, the errors along the lines 304 are received at a PIPE 410. (For the purposes of this application, the PIPE devices in FIG. 4 and the other drawing figures are defined as latch devices which receive and release incoming data, with some semblance of synchronism being provided between the various PIPE devices to insure proper data flow through the embodiment of the present invention.) The PIPE 410 outputs the errors to a comparator 430 constructed of eighteen AND gates. The comparator 430 also receives eighteen error enable signals along the lines 422 from an enable register 420.

It should be apparent from the foregoing that the preferred embodiment of the present invention can receive error signals up to eighteen bits wide, and can monitor all, or any subset, of these eighteen bits by appropriately setting logical "1"s (to enable) and logical "0"s (to disable) in the enable register 420. As an example, if only the four least significant bits (LSBS) are of interest, a logical "000000000000001111" value set into, and output from, the enable register 420 would cause the eighteen AND gates effectively to block all the error signal bits except for the four LSBS. Eighteen ANDed signals are output by the comparator 430 along the lines 432 to the eighteen wide (i.e., eighteen input) OR gate 450 which performs an ORing operation and outputs an error signal along the line 452. It should be apparent that this output error signal will be generated if an error is indicated in any of the enabled bits of the original (eighteen bit wide) error signal. The PIPE 470 receives and releases the output error signal to insure proper data flow through the embodiment of the present invention.

FIG. 5A is a block diagram showing further construction details of either of the area select latches illustrated in FIG. 3. For sake of simplicity, FIG. 5A will be discussed mainly with respect to the (x-axis) area select latch 324, and, further, since the four area select portions 502, 504, 506 and 508 are similar in construction, only one area portion 502 will be discussed in detail.

A PIPE 520 of the area portion 502 receives input x-addresses along lines 322, and releases the x-addresses along lines 522 to the compare mask circuit CMPMSK 550 and the PIPE 560. In addition to the x-addresses (designated as "A"), the CMPMSK 550 also receives twelve bits of mask signals (designated as "C") along lines 532 from a mask register MASK 530, and twelve bits of area signal (designated as "B") along lines 542 from an AREA register 540. The CMPMSK 550 is constructed of twelve logical comparator circuits, each comparator circuit comparing different sets of single bits A, B and C from each of the x-addresses, AREA register 540 and the MASK register 530, respectively.

An example of a preferred one of these comparator circuits is depicted in block form as circuit 552-1 which is shown in greater detail in FIG. 6A. More particularly, the comparator circuit 552-1 is constructed of a NAND gate, two AND gates, and a NOR gate, and is arranged such that (as can be seen in the logical truth table of FIG. 6B) its output D-1 is normally low (i.e., at a logical "0") and goes high (i.e., to a logical "1") whenever any of the paired A and B inputs are the same, or when the C input is low.

The twelve outputs (e.g., D-1) from the twelve logical comparator circuits are all connected to different inputs of the twelve input AND gate 554 (shown in greater detail in FIG. 6C), and if all twelve inputs from the twelve comparator circuits have been enabled, the AND gate 554 outputs a high (i.e., logical "1") enable output signal to the PIPE 560 along the line 556. The PIPE 560 releases the x-addresses and the enable output signal to insure proper data flow through the embodiment of the present invention.

The enable output signals from the area select portions 502, 504, 506 and 508 are designated as ENABLE1, ENABLE2, ENABLE3 and ENABLE4, respectively.

It should be apparent from the foregoing that the described area select portions can receive address signals up to twelve bits wide, and can monitor all, or any subset, of these twelve bits for a determination as to whether or not the incoming address pertains to a memory area which is of interest to the area select portion. Such selective monitoring can be done by appropriately setting, in the mask register 530, logical "1"s (to enable comparison of selected ones of the input address bits A and area register bits B), and logical "0"s (to disable or indicate the comparison of selected ones of the input address bits A and the area register bits B as "don't care" comparisons). In a preferred approach, typically the most significant bits (MSBs) are used to monitor for appropriate memory area.

As an example, in the embodiment with twelve x-addressing bits (representing 8K of x-addresses), a logical "111000000000" value set into, and output from, the mask register 530 (as indicated in the logical table of FIG. 5B) would cause the three MSBs of the x-address to be compared, and the nine LSBs to be indicated as "don't care" comparisons. More particularly, the logical "1" values of the upper three "C" bits output from the mask register 530 would effectively enable the upper three logical comparator circuits (pertaining to the three MSBs) to perform a comparison of the input address bits A and area register bits B, while the logical "0" values of the lower nine "C" bits output from the mask register 530 would effectively lock all nine logical comparator circuits (pertaining to the nine LSBs) to always output a logical "1". The ANDing function performed by the AND gate 554 would thus depend only on the three MSBs.

After a mask value has been set into the mask register 530 to mask out the "don't care" bits of the X-address, a further area value must be set into the area register 540 in order to indicate the logical bit values of the memory area which are of interest. In the example illustrated in FIG. 5B, it can be seen that a logical "101XXXXXXXXX" (where X's indicate irrelevant bits masked out by the mask register 530) has been set, indicating that only fail having a value "101" for the three MSBs are of interest to the cell selects serviced by this area select portion 502. Using FIG. 5B as examples of typical situations, a comparison of the three MSBs of the first input address of FIG. 5B with those of the area register results in a match, and, accordingly, this first input address pertains to the memory area which is of interest to this area select latch, and an enable output signal is a logical "1". Similar analysis can be made as to the third input address. In contrast, comparison of the three MSBs of the second (middle) input address of FIG. 5B with those of the area register does not result in a match, and, accordingly, this second input address does not pertain to the memory area which is of interest to this area select latch, and an enable output signal is a logical "0".

Figure 7:
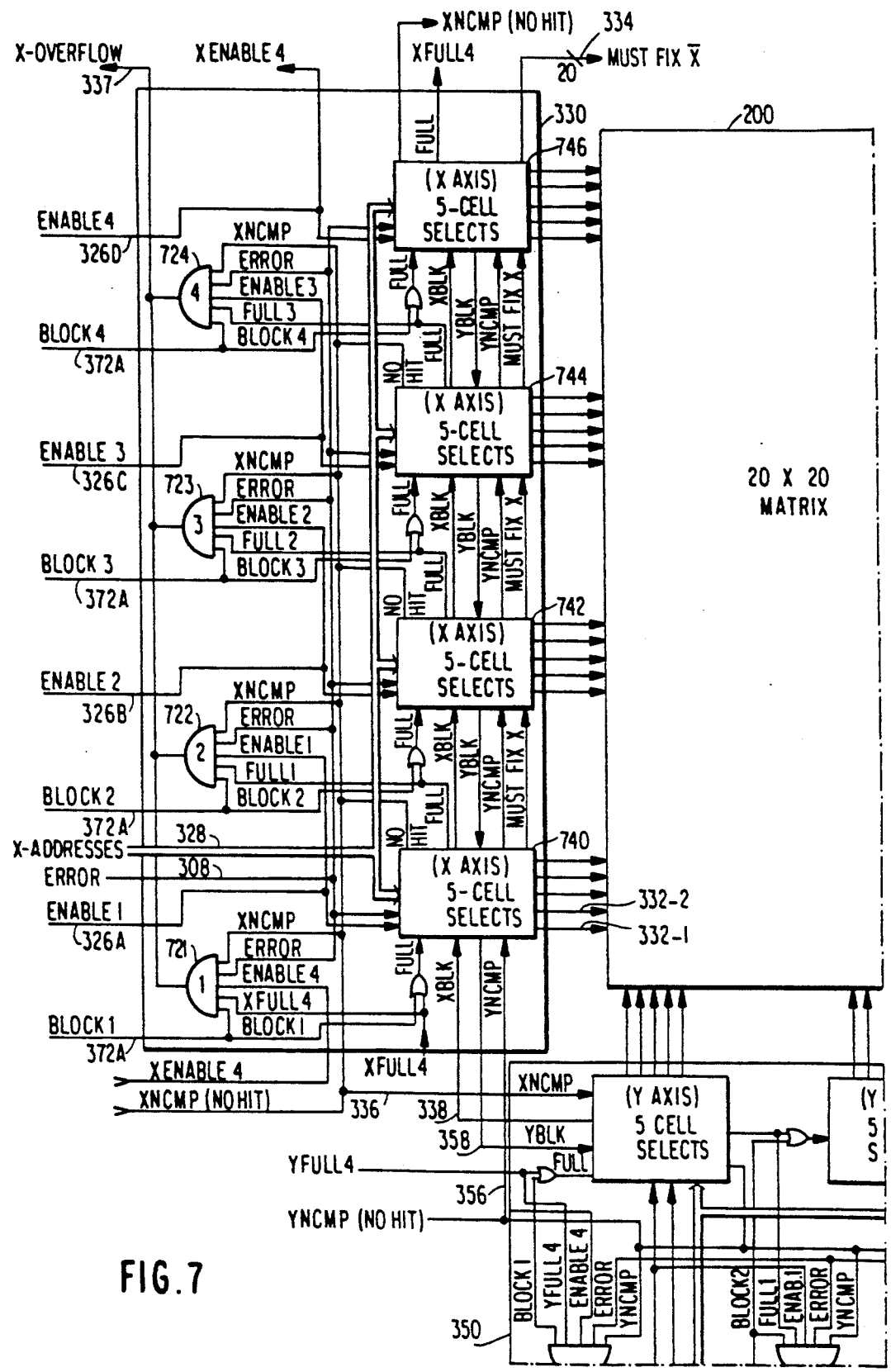
FIG. 7 is a block diagram of a cell enable and overflow signaling arrangement of the preferred embodiment of the invention.

FIG. 7 is a block diagram of the cell enable and overflow signaling arrangement of the preferred embodiment of the invention. For simplicity of discussion, since the (x-axis) cell enable 330 and the (y-axis) cell enable 350 are identical in construction, FIG. 7 will be discussed mainly with respect to the (x-axis) cell enable 330.

As mentioned previously, the (x-axis) cell enable 330 receives the x-addresses along the twelve bit lines 328, ENABLE 1-4 signals along the four bit lines 326A-D, an error signal along the line 308, a y-no-compare (YNCMP) signal along a line 356, an x-block (XBLK) signal along a line 338, and BLOCK 1-4 signals along the four bit lines 372A. In response, the (x-axis) cell enable 330 may generate an X signal along one of the twenty column lines 332 (e.g., 332-1, 332-2, etc.) for input to the 20×20 matrix 200, a MUST FIX $\overline{X}$ signal along one of the twenty signal lines 334, and an overflow flag signal along the line 337.

The (x-axis) cell enable 330 contains overflow AND gates 721, 722, 723 and 724 (also known as AND gates 1, 2, 3 and 4, respectively). Each of the overflow AND gates receives a x-no-compare (XNCMP) signal, an error signal from the line 308, an ENABLE signal from an immediately preceding stage (note that, for the first overflow AND gate 721, this means that the XENABLE4 signal is wrapped-around for input to the gate 721), a FULL signal also from an immediately preceding stage (note that, for the first overflow AND gate 721, this means that the XFULL4 signal is wrapped-around for input to the gate 721), and a BLOCK signal. Any one of the overflow AND gates 721-724 can be programmed (as discussed ahead) to detect and signal an overflow condition, and when programmed, such AND gate will signal such an overflow only when all of the just-described inputs to that AND gate are a logical "1".

An important aspect to note in this regard is that the BLOCK1-4 signals from the block register 370A can be used selectively to program (i.e., enable) different matrix sizes regarding overflow. As an example, if a logical value "1000" having sequential bits corresponding to the BLOCK1, BLOCK2, BLOCK3 and BLOCK4 signals, respectively, are output by the block register 370 and is input to the overflow AND gates 1, 2, 3 and 4, respectively, only overflow AND gate 1 would be enabled to detect an overflow which would occur only upon the next error signal, i.e., in this case, only after all twenty (x-axis) cell selects have stored address values. Accordingly, a logical value "1000" would program the overflow AND gates to detect overflow of the 20×20 matrix. As an alternative example, if a logical value "0010" is output by the block register 370, and input to the overflow AND gates 1, 2, 3 and 4, respectively, only overflow AND gate 3 would be enabled to detect an overflow which would occur only upon the next error signal, i.e., after the first ten (x-axis) cell selects have stored address values. Accordingly, a logical value "0010" would program the overflow AND gates to detect overflow of a 10×10 matrix.

It is further understood that modification of the illustrated and described overflow signalling arrangement with additional and/or alternative over AND gates so as to allow any desired matrix size to be programmably defined by appropriate BLOCK signals, is well within the abilities of a skilled artisan, and such are meant to be within the scope of the claimed invention. As examples, overflow AND gates may alternatively be connected to receive the FULL signals from the second, sixth, twelfth and twentieth (x-axis) and (y-axis) cell selects so as to be programmable to define 2×2, 6×6, 12×12 and 20×20 matricies, respectively, which are required for fail capture and compression for typical memory array redundancies of 1×1, 2×2, 3×3 and 4×4, respectively.

It is an important feature of the present invention that overflow can be signaled and detected. More particularly, the arrangement of the present invention and the matrix size of the compression matrix, in essence, define the limits of redundancy repair. If captured errors cannot be compressed to fit within the compression matrix, an overflow is signaled, and such is an indication that the DUT cannot be repaired with the available redundancy. DUT testing, data capture and compression can then be immediately stopped, thereby saving testing time. It should be further stated that the opposite is not true, i.e., capture and compression of the total errors to fit within the compression matrix are not any guarantee that the DUT can be repaired by the available redundancy. An example of such is discussed below.

The (x-axis) cell enable 330 further contains (x-axis) 5-Cell Selects 740, 742, 744 and 746. Each of the 5-Cell Selects receives a y-no-compare (YNCMP) signal along a line 356, a X-block (XBLK) signal along the line 338, a FULL signal from a preceeding stage (note that, for the first 5-Cell Selects 740, this means that the XFULL4 signal is wrapped-around for input to the OR gate associated with the the 5-Cell Selects 740), an ENABLE signal from the (x-axis) area select latch 324, an error signal along the line 308, x-addresses along the lines 328, and an x-no-compare (XNCMP) or NO HIT along a line 336. In response thereto, each 5-Cell Selects may generate a y-block (YBLK) signal along a line 358, a x-no-compare (XNCMP) or No Hit signal along a line 336, a FULL signal, a MUST FIX $\overline{X}$ signal along one of the twenty signal lines 334, and an X signal along one of the twenty bit lines 332 (e.g., 332-1, 332-2, etc.) for input to the 20×20 matrix 200.

Figure 8:
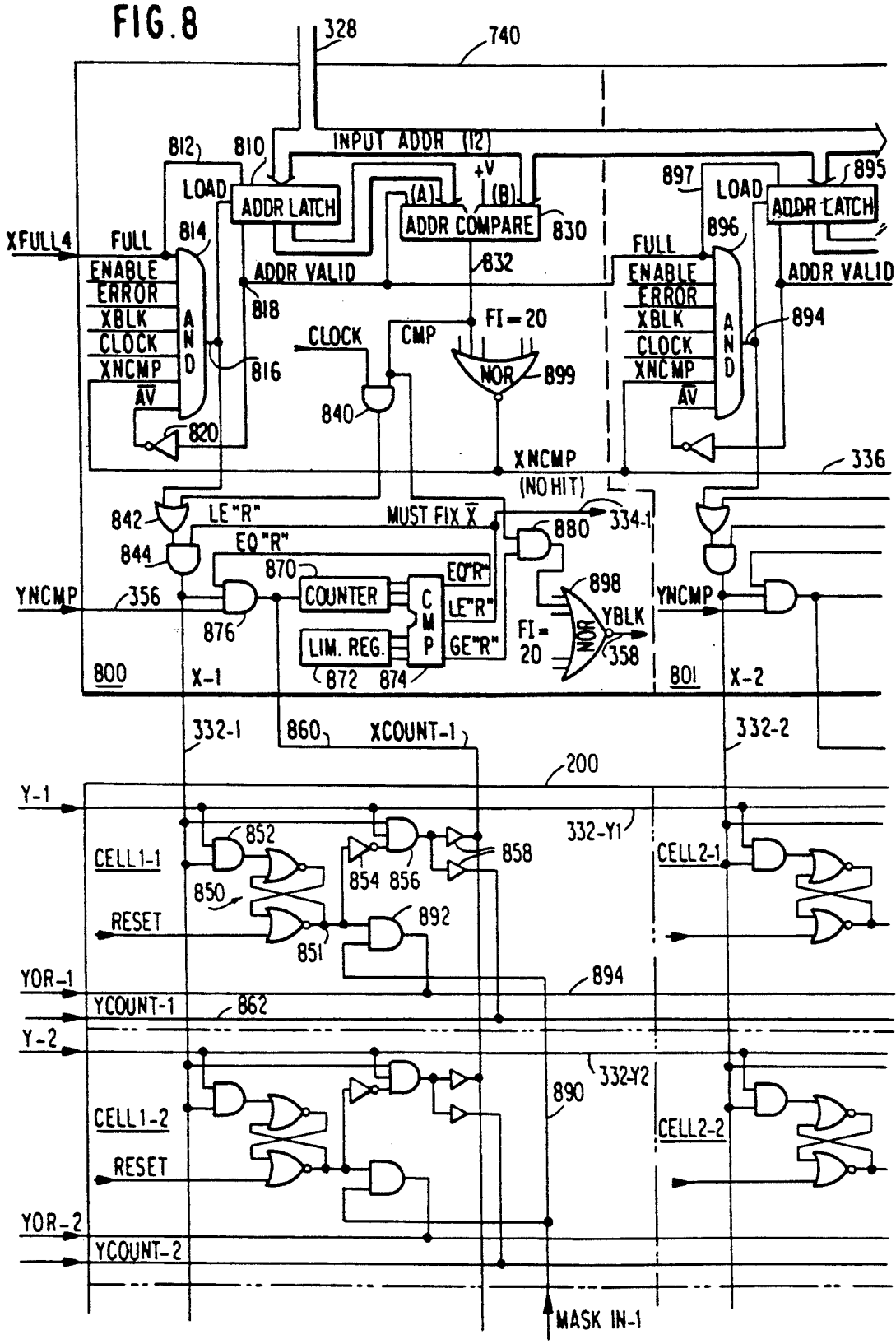
FIG. 8 is a block and logical gate diagram showing further construction details of one of the (x-axis) cell selects, and one of the 20×20 matrix cells of a preferred embodiment of the invention.

FIG. 8 is a block and logical gate diagram showing further construction details of one of the (x-axis) cell selects, and one of the 20×20 matrix cells of the preferred embodiment of the invention. More particularly, there are shown a first cell select 800 and a portion of a second cell select 801 of the (x-axis) 5-cell select 740, and a first compression matrix cell CELL 1-1 and a portion of further compression matrix cells CELL 1-2, CELL 2-1 and CELL 2-2. As the twenty (x-axis) cell selects and the twenty (y-axis) cell selects are similar in construction, and further, as all the 400 compression matrix cells are similar in construction, for simplicity of discussion FIG. 8 will be discussed mainly with respect to the first cell select 800 and the first matrix cell CELL 1-1.

Prior to testing each of the address latches 810 of the twenty (x-axis) and twenty (y-axis) cell selects is initialized not to correspond to any of the rows and columns of the memory array subdivision of the DUT, and to output an ADDRESS NOT VALID (i.e., logical "0") along the line 818. Further, each limit register 872 of the twenty (x-axis) and twenty (y-axis) cell selects is initialized to contain a value "D" which is equal to the number of redundancy rows and columns ("4" in the present example), and each counter 870 is initialized to contain a zero count. As a result of the initialization of the limit register and counter, the comparator CMP 874 outputs a logical "0" along an equal-to EQ line thus disabling the AND gate 876, outputs a logical "1" along the less-than-or-equal to LE line thus enabling the AND gate 844, and outputs a logical "0" along the greater-than-or-equal-to GE line thus disabling the AND gate 880. A RESET input of each latch 850 is utilized to reset all of the compression matrix cells to contain a logical "0" on the latch node 851. The block register 370 (FIG. 3) is initialized to contain a logical value having sequential bits corresponding to the desired BLOCK1, BLOCK2, BLOCK3 and BLOCK4 signals, respectively. The enable register 420 (FIG. 4) is initialized to contain a logical value which will effectively block all error signal bits except for the bits which are of interest. The mask register 530 is initialized to contain a logical value, the "1"s bits of which cause preselected bits of the x- and y-addresses to remain unmasked for comparison, and the "0"s bits of which mask out the remaining bits of the x- and y-addresses as "don't care" comparisons. Finally, the area register 540 is initialized to contain an area value to indicate the logical bit values of the memory area which is of interest.

In FIG. 8, the first cell select 800 receives the x-addresses along line 328, and these x-addresses are applied to the input terminals of an address latch (ADDR LATCH) 810. A latching function of the address latch 810 is controlled by a load output from an AND gate 814, and by a FULL signal along a line 812. More particularly, before an address latch 810 can latch in a x-address portion of a DUT address, a first prerequisite is that a logical "1" value is received along a line 812 thus to enable the latch 810. After initialization (and up until a time that a DUT address is latched), the first address latch 810 receives a logical "1" along the line 812 from the block register 310 instead of the wrap-around XFULL4 output from the twentieth cell select, because the logical "0" which is typically output from the twentieth cell select after initialization would block the first cell select from operating.

A second prerequisite is that a "loading" operation of the address latch 810 is not effected until all of the input signals to the controlling AND gate 814 are at a logical "1". More particularly, for a loading operation to occur, the FULL signal input must be "1" (such is typically met, immediately after initialization, for the first cell select as described above), the ENABLE signal must be "1" (i.e., the present input address must pertain to the memory area which is of interest, which has been set into the area select latch 324), the ERROR signal must be "1" (i.e., an error must be indicated along any of the unmasked bits of the original error signal), the XBLK signal must be a "1" (i.e., the error must not occur along a memory array line which has already been flagged as a "must repair"), a clock signal must be a "1", an XNCMP signal must be a "1" (i.e., the present address must not compare to any address which has already been stored in a different address latch), and finally the $\overline{AV}$ signal must be a "1" (i.e., the present address latch must not already contain a valid address value).

Assuming that all of the above prerequisites are met, the controlling AND gate 814 generates a logical "1" along the line 816 which causes the address latch 810 to latch in and store the input address which is presently impressed upon its input terminals. This logical "1" load signal along the line 816 also propagates through the OR gate 842, through the enabled AND gate 844 and along the (x-axis) line X-1 to arrive at the AND gate 852 which acts as a set input gate to the matrix cell latch 850. (Note that, as the counter 870 contains a count value of zero (0) and the comparator 874 thus outputs a logical "0" level along the equal-to EQ line, the AND gate 876 is disabled from allowing the logical "1" signal (along line X-1) to propagate therethrough to act as a count pulse to increment the counter.)

In the present example, it will be assumed that no y-addresses have previously been latched into any of the (y-axis) cell selects. Accordingly, while the x-address portion of the present address is being latched into the first (x-axis) cell select (as described above), the y-address portion is being latched into the first (y-axis) cell select, and thus a logical "1" signal propagates along the (y-axis) line Y-1 and arrives at the AND gate 852 about the same time as the logical "1" along the (x-axis) X-1 line. Upon the concurrent arrival of these signals at the AND gate 852, the latch 850 is latched now to store a logical "1" value at the node 851. Further, the transition of the node 851 from a logical "0" value to a logical "1" value is fed through an inverter 854 to cause the output of the AND gate 856 to change from a logical "1" to a logical "0". This AND gate transition from logical "1" to a logical "0" is applied through diode amplifiers 858 as a count pulse to an XCOUNT-1 line 860 and YCOUNT-1 line 862, to be applied to, and increment, counters associated with these lines, e.g., the counter 870 is incremented to a count of one (1). (Note that, for sake of simplicity and non-crowding of illustration, the count lines (e.g., XCOUNT-1, YCOUNT-1) are not illustrated in FIGS. 3 or 7.)

To summarize, at the end of the above described operation, the x-address portion of the present input address has been latched into the address latch 810 and is being outputted and applied to an (A) side of an address comparator 830, a logical "1" ADDRESS VALID signal is output along the line 818 both to enable an address comparator ADDR COMPARE 830 and also propagate through the inverter 820 to disable the controlling AND gate 814 from generating further load signals, the counter 870 has been incremented to a count of "1", and a logical "1" (representative of a captured error) has been stored in the compression matrix cell CELL 1-1 as indicated by the "*" 210 in FIG. 2.

In a continuing example, a second error is assumed to have an input address with the same x-address portion as the first error, but a different y-address portion.

When the x-address portion arrives at the first cell select 800 along lines 328, the address comparator 830 recognizes the present x-address as matching the x-address which has already been stored in the address latch 810, and, accordingly, the address comparator outputs a logical "1" compare CMP signal along the line 832. This compare CMP signal propagates through the twenty input NOR gate 899 to produce a logical "0" level along the XNCMP line 336, with the logical "0" level being applied to, and thus preventing the AND gate of the next cell select 801 from loading this redundant x-address. (It should be noted that the twenty input NOR gate 899 is not dedicated to servicing the first cell select 800 alone, but instead each of its twenty input terminals receives a compare signal from a different one of the 20 (x-axis) cell selects.)

The compare CMP signal also propagates through the AND gate 840 (i.e., concurrently in time with a clock pulse), through the OR gate 842, through the still-enabled AND gate 844 and along the (x-axis) line X-1. Concurrently with the just-described operations, the "new" (i.e., previously unlatched or uncaptured) y-address portion is latched into a second (y-axis) cell select, and thus a logical "1" signal propagates along the (y-axis) line Y-2 to arrive at the AND gate of the matrix cell CELL 1-2 about the same time as the logical "1" along the (x-axis) X-1 line. The setting of the latch for this matrix cell CELL 1-2, and the generation of clock signals along the lines XCOUNT-1 and YCOUNT-2, are similar to those described above. Upon completion of operations, a logical "1" (representative of a captured error) has stored in the compression matrix cell CELL 1-2 as indicated by the "*" 211 in FIG. 2.

Discussions concerning exemplary third and fourth errors having input addresses with the same x-address portion as the first and second errors, but each with different, "new" y-address portions, would proceed along lines similar to the above discussion, and would detail logical "1"s (representative of the captured errors) being produced and stored in the compression matrix cells CELL 1-3 and CELL 1-4 (not shown) as indicated by the "*"s 212 and 213 in FIG. 2.

After the fourth error has been processed as described above, the counter 870 (FIG. 8) contains a count value of "4", which compares in value (i.e., is equal) to the redundancy value "R" which itself is four (4) in the present example. Accordingly, the comparator 874 outputs a logical "1" level along each of the equal-to EQ, less-than-or-equal-to LE and greater-than-or-equal-to GE lines.

An exemplary fifth error, having an input address with the same x-address portion as the first through fourth errors but different, "new" y-address portion, IS illustrative of further important operations within the present invention.

When the fifth error is encountered, the x-address portion arrives at the first cell select 800 along lines 328, the address comparator 830 recognizes the present x-address as matching the x-address which has already been stored in the address latch 810, and accordingly, the address comparator outputs a logical "1" compare CMP signal along the line 832. This compare CMP signal propagates through the twenty input NOR gate 899 to produce a logical "0" level along the XNCMP line 336, this logical "0" level being applied to, and thus preventing, the AND gate of the next cell select 801 from loading this redundant x-address. The compare CMP signal also propagates through the AND gate 840 (i.e., concurrently in time with a clock pulse), through the OR gate 842, through the still-enabled AND gate 844 and along the (x-axis) line X-1.

The compare CMP signal further propagates through the AND gate 880 (which is now enabled due to the logical "1" level along the greater-than-or-equal-to GE line), and through the NOR gate 898 to change the normally "HIGH" (i.e., "1" enabling) level YBLK signal to a "LOW" (i.e., "0" disabling) level. (It should be noted that the twenty-input NOR gate 898 is not dedicated to servicing the first cell select 800 alone, but, instead, each of its twenty input terminals receives an AND gate 880 signal from a different one of the twenty (x-axis) cell selects.)

The "LOW" YBLK signal propagates along a line 358 to the (y-axis) cell selects, particularly to disable the (y-axis) controlling AND gates (not shown, but comparable to the AND gates 814) such that all twenty of the (y-axis) cell selects are prevented from latching or capturing the y-address portions of the present error. The rationale for this is that the x-column 1 (already having an error count of "4") is scheduled to be designated as a "must fix" column and will thus fix the present and any future encountered errors along this column anyway, so it would in essence be redundant and inefficient to continue to use the limited number of (y-axis) cell selects to capture these errors.

As this "new" y-address of the present (i.e., fifth) error has not previously been latched or captured by the (y-axis) cell selects, and is prevented from being so by the YBLK signal, none of the twenty (y-axis) cell selects will generate a logical "1" signal to propagate along one of the (y-axis) lines (e.g, Y-1, Y-2, etc.) to arrive at the AND gate of a matrix cell (e.g., CELL 1-1, CELL1-2, etc. ) at the same time as the logical "1" along the (x-axis) X-1 line, and, accordingly, no further matrix cells along the x-column 1 will be set. Further, none of the (y-axis) address compares (not shown, but comparable to the address compare 830) will detect an address match, and, accordingly, the y-no-compare YNCMP signal from the (y-axis) cell enable 350 will remain at a logical "1" (i.e., HIGH) level.

This logical "1" YNCMP signal, together with the present logical "1" signal from the equal-to EQ line, enables the AND gate 876, thereby allowing the logical "1" signal along the line X-1 to propagate therethrough to act as a count pulse to increment the counter 870 to a count of "5". Accordingly, the counter 870 (FIG. 8) now contains a count value which is higher that the redundancy value "D" ("4" in the present example) stored in the limit register 872, and, accordingly, the comparator 874 outputs transition, to, and maintain, a logical "0" level along each of the equal-to EQ and less-than-or-equal-to LE lines, and a logical "1" level along the greater-than-or-equal-to GE line. The logical "0" level along the less-than-or-equal-to LE represents a MUST FIX X̄ which is output along the line 334-1, and the logical "1" level along the greater-than-or-equal-to GE maintains guard to allow the AND gate 880 and the NOR gate 989 to generate the YBLK signal whenever the input address along the lines 328 has an x-address portion which matches that stored in the address latch 810, to block any further capture of y-addresses of errors already designated to be fixed with respect to this "must fix" column.

An exemplary sixth error is useful in showing that the twenty (x-axis) cell selects sequentially latch or capture different DUT error addresses beginning with the first (x-axis) cell select 800 (as discussed above) capturing the first DUT error address, and then each sequential (i.e., next available) cell select capturing the next occurring DUT address. More particularly, as testing is conducted, each available (i.e., next sequential) cell select column is assigned, and associated with, a different X-address value of the DUT, only when a failure is detected along a new DUT X-column. Similarly, each available (i.e., next sequential) cell select row is assigned, and associated with, a different Y-address value of the DUT only when a failure is detected along a new DUT Y-row.

The sixth error is assumed to have an input address having both a x-address portion and an y-address portion which are different from those which have been thus latched or captured.

As to the first (x-axis) cell select, the address latch 810 has previously latched in the first DUT error address and has output a logical "1" ADDRESS VALID signal (from the time of capture of the first error address) along the line 818 to disable the controlling AND gate 814 from generating and outputting further load signals to the address latch 810. Further, the address comparator 830 recognizes the present (sixth error) x-address as not matching the (first) x-address which has previously been stored, and accordingly, the address comparator does not change the normally logical "0" compare CMP signal along the line 832 or the normally logical "1" XNCMP signal along the line 336.

As to the second (x-axis) cell select 801, the x-address portion along lines 328 are applied to the input terminals of an address latch (ADDR LATCH) 895. A latching function of the address latch 895 is controlled by a load output from an AND gate 896, and a FULL signal along a line 897 in a manner similar to that discussed above for the first cell select 800. However, the logical "1" ADDRESS VALID signal output by the previous address latch 810 is utilized as the FULL signal input to the AND gate 896 and is present along the line 897. Note that, in essence, it is this "forward-feeding" of the ADDRESS VALID signal which causes the twenty (x-axis) cell selects sequentially to latch or capture different DUT error addresses.

Assuming that all of the other (above-discussed) prerequisites are met, the controlling AND gate 896 generates a logical "1" along the line 894 which causes the address latch 810 to latch in and store the input (sixth error) address which is presently impressed upon its input terminals. There is a further progression of operations (similar to those discussed above for the second error example) which set a logical "1" into the compression matrix cell CELL 2-1 (indicated by the "*" 220 in FIG. 2), and increment a counter associated with this second x-column.

Capture and compression of multiple errors occurring along a same memory array row (y-axis) line (i.e., having input addresses with the identical y-address portions, but each with different x-address portions) would proceed in a manner similar to that discussed above with respect to memory array column (x-axis) lines, and would result in logical "1"s (representative of the captured errors) being stored along row (y-axis) lines of the compression matrix 200, e.g., such as those indicated by the "*"s 260, 261, 262 and 263 in FIG. 2.

The present invention effects only error capture and compression, and a "must repair" analysis (i.e., a flagging of "must repair" DUT rows and columns). Once a total capture and compression has been completed with the present invention, the "must repair" signals, the compressed fail information and the captured DUT error addresses contained in the address latches (e.g., 810) must be read out and further processed, for example, by the MUST FIX Y circuit 380, analysis detector 384, solution latch 390, all combination pattern circuit 395 and MUST FIX X circuit 397. Such additional circuitry provides additional "sparse repair" analysis, i.e., an analysis of the fail information pertaining to the "non-must repairs" to determine whether repair can be effected using the available redundancy.

In addition to the captured DUT addresses being able to be outputted using a serial path (not shown) connecting each of the address latches 810, the logical "1" values latched and stored on the matrix cell modes 851 and corresponding to the compressed fail information may be output using a combination of the MASK IN lines and YOR lines.

More particularly, the MUST FIX X circuit 397 can be used to apply sequential, time separated logical "1" levels along each of the twenty MASK IN lines 890 (e.g., MASK IN-1) such that the AND gate 892 is enabled for any matrix cell, along the column serviced by the MASK IN line, which has a logical "1" stored at its node 851. For such matrix cells, a logical "1" value will be impressed on the YOR line by the AND gate 892. Output values for the twenty matrix cells disposed along, and serviced by, the MASK IN line e.g., MASK In-1) are read out in parallel along twenty YOR lines.

As mentioned above, capture and compression of the total errors to fit within the compression matrix are not any guarantee that the DUT can be repaired by the available redundancy. As an example, if thirty-two errors had been captured and compressed as indicated by the "*"s in FIG. 2, and an additional error had been captured and compressed, for example, in a matrix cell indicated by 280 (FIG. 2), a DUT, to which this compress fail information pertained, would not be reparable by the available redundancy.

Figure 9:
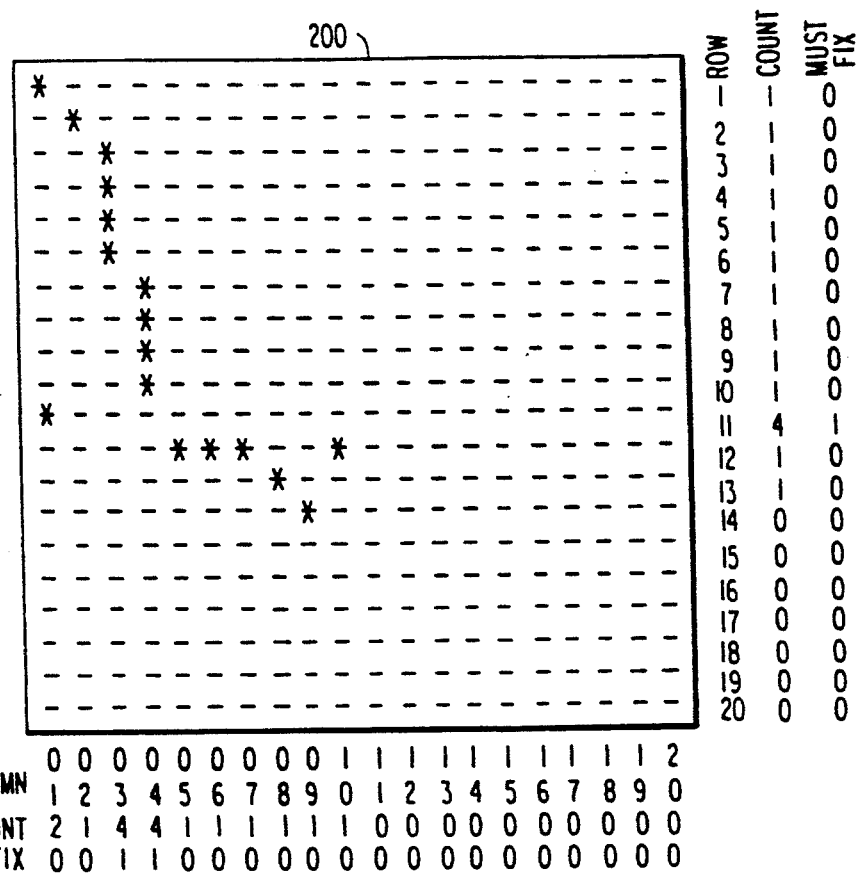
FIG. 9 is a simplified illustration of a compression matrix illustrating compressed fail information with three "must fix" situations, and requiring further "sparse analysis" to effect redundancy repair.

FIG. 9 is a simplified illustration of a compression matrix having compressed fail information with three "must fix" situations, and requiring further "parse analysis" to effect redundancy repair. More particularly, FIG. 9 is exemplary of a situation where "must fix" analysis would indicate "must fixes" along columns 3 and 4 and row 12, and "sparse analysis" would further indicate the ability for successful repair by using the additional columns 1 and 2 and rows 13 and 14.

Figure 10:
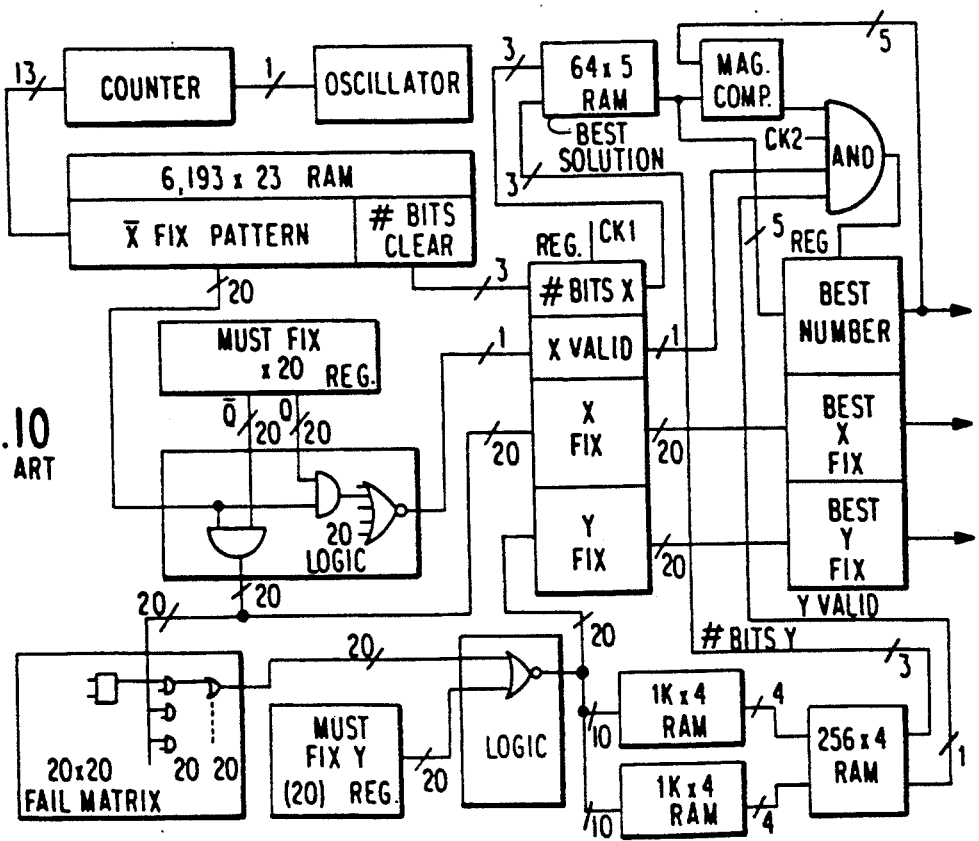
FIG. 10 is a block diagram of a prior art best solution generator which can be used to conduct "sparse redundancy analysis" to complete a best solution after "must-fix redundancy analysis" has been conducted by the preferred embodiment of the present invention.

FIG. 10 is a block diagram of a prior art best solution generator which can be used to conduct "sparse redundancy analysis" to complete a best solution after "must-fix redundancy analysis" has been conducted by the preferred embodiment of the present invention. Such best solution generator is exactly that disclosed and described in IBM TDB Vol. 29, No. 6, November 1986, pp. 2756-2758, "BEST SOLUTION GENERATOR FOR REDUNDANCY", (author unknown).

Although a particular embodiment of the invention has been described and illustrated herein, it is recognized that many modifications and variations not discussed herein may readily occur to those skilled in the art, and consequently, it is intended that the claims be interpreted to cover such modifications and equivalents.

What is claimed is:

1. A tester for testing fail cells in a semiconductor array having a plurality of cells arranged in rows and columns and having redundant rows and columns, and containing a best solution generator for redundancy repair, said tester comprising:

a fail matrix, said matrix comprising a plurality of cells, smaller than the number of cells in the array, arranged in rows and columns, the number of rows in said fail matrix being equal to (the number of redundant rows in said array) times (the number of redundant columns in said array plus 1), and the number of columns in said fail matrix being equal to (the number of redundant columns in said array) times (the number of redundant rows in said array plus 1); and means for loading said fail matrix with information pertaining to failed cells as such failed cells are detected by the tester, said means for loading including a row enable circuit and a column enable circuit; wherein each of said enable circuits comprises:

a counter connected to a comparator circuit which is also connected to a preset register;

input means including AND means for receiving said failed information from the tester coupled to said counter and said fail matrix for counting unique fails and recording each of the unique fails in a respective selected matrix cell, and feedback means, coupled between said comparator and said AND means, for disabling said AND means and the counter to disable the other enable circuit when the count of said fails on any selected row or column in the array reaches the number preset in the register.

* * * * *